United States Patent
Lee

(10) Patent No.: US 7,102,425 B2
(45) Date of Patent: Sep. 5, 2006

(54) HIGH VOLTAGE GENERATION CIRCUIT

(75) Inventor: Geun Il Lee, Yongin-Shi (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 7 days.

(21) Appl. No.: 10/878,257

(22) Filed: Jun. 28, 2004

(65) Prior Publication Data

US 2005/0231266 A1   Oct. 20, 2005

(30) Foreign Application Priority Data

Apr. 20, 2004   (KR) ..................... 10-2004-0027092

(51) Int. Cl.
*G05F 1/10* (2006.01)
(52) U.S. Cl. ........................ 327/589; 37/540
(58) Field of Classification Search ........... 365/189.09, 365/226, 222, 227; 327/536–537, 589, 540, 327/390
See application file for complete search history.

(56) References Cited

U.S. PATENT DOCUMENTS 5,701,096 A * 12/1997 Higashiho .................. 327/536
5,708,387 A * 1/1998 Cleveland et al. .......... 327/536
6,084,800 A * 7/2000 Choi et al. ............. 365/185.23
6,225,854 B1 * 5/2001 Cha ........................... 327/536
6,255,900 B1 * 7/2001 Chang et al. ............... 327/589
6,320,457 B1 * 11/2001 Yang .......................... 327/536
6,356,501 B1 * 3/2002 Park et al. .................. 365/226
2002/0171470 A1 * 11/2002 Sim et al. ................... 327/536

FOREIGN PATENT DOCUMENTS

KR    1996-0035622    10/1996

* cited by examiner

Primary Examiner—Dinh T. Le
(74) Attorney, Agent, or Firm—Marshall, Gerstein & Borun LLP

(57) ABSTRACT

Provided is directed to a high voltage generation circuit capable of improving a yield by controlling a defect due to a write recovery time tWR margin shortage, by including: a first high voltage generation unit for generating a first high voltage during an active operation and then applying it to a cell word line; and a second high voltage generation circuit for generating a predetermined voltage during a precharging operation, and then applying a second high voltage higher than the first high voltage to the cell word line.

20 Claims, 5 Drawing Sheets

HIGH VOLTAGE GENERATION CIRCUIT

This application relies for priority upon Korean Patent Application No. 2004-0027092 filed on Apr. 20, 2004, the contents of which are herein incorporated by reference in their entirety.

BACKGROUND

1. Field of the Invention

The present invention relates to a high voltage generation circuit, and more particularly to, a high voltage generation circuit capable of improving a yield by controlling a defect due to a write recovery time tWR margin shortage, by generating a first high voltage during an active operation and generating a second high voltage higher than the first high voltage, in sequence, during a precharging operation.

2. Discussion of Related Art

Dynamic Random Access Memory DRAM is a volatile memory device storing data in a cell comprised of a transistor and a capacitor. In order to read and write data in the DRAM cell, a high voltage Vpp higher than an external supply voltage Vcc is generated and applied to a cell word line. As a result, a cell transistor is turned on/off. However, when the high voltage is too high, it has a bad influence to reliability of the cell transistor. Accordingly, the DRAM device has used a voltage a little bit higher than a voltage that adds the external supply voltage Vcc and a threshold voltage Vt of the cell transistor.

The high voltage is generated by using a high voltage generation circuit as shown in FIG. 1. The high voltage generation circuit is basically comprised of an oscillator 11, a pumping circuit 12, and a level detection circuit 13. The oscillator is operated by an enable signal EN, generating an oscillation signal OSC with a constant period. The pumping circuit 12 generates a high voltage Vpp by a pumping operation using an external supply voltage Vcc in response to the oscillation signal OSC. Furthermore, the level detection circuit 13 detects whether or not the high voltage is risen to a target value by comparing a reference voltage and the high voltage Vpp, and according to the result, the level detection circuit 13 controls the operation of the oscillator 11 and maintains a constant potential of the high voltage.

However, as a design rule is getting smaller, the sizes of a a storage node contact and a bitline contact of a cell transistor are getting smaller as well. As a result, as cell threshold voltages have different values according to a manufacturing process, and thus there are many cells which can't transfer data of the bitline to a cell capacitor within a constant time, a yield of the device is decreased thereto. Especially, during a data write operation, a defect by a write recovery time tWR margin shortage, as a time fixed for storing data in the cell capacitor before precharing operation, is becoming a serious problem these days when the manufacturing process is getting sub-micron design-rule.

SUMMARY OF THE INVENTION

The present invention is directed to provide a high voltage generation circuit capable of improving operation characteristics of a cell by doubly generating a high voltage used to read and write data in a memory cell, and increasing a yield by normally operating a defective cell generated due to a margin shortage.

Another object of the present invention is to provide a high voltage generation circuit which can generate a first potential of high voltage during an active operation, and generate a second potential of high voltage higher than the first high voltage, in sequence, during a precharing operation.

Here, the high voltage generation circuit in accordance with an embodiment of the present invention includes: a first high voltage generation unit for generating a first high voltage during an active operation and then applying it to a cell word line; and a second high voltage generation circuit for generating a predetermined voltage during a precharging operation, and then applying a second high voltage higher than the first high voltage to the cell word line.

The first high voltage generation unit includes: an oscillator for generating an oscillation signal with a constant period by being operated in response to an enable signal; a pumping circuit for generating the first high voltage by means of a pumping operation using an external supply voltage in response to the oscillation signal; and a level detection circuit for comparing the first high voltage with a reference voltage and maintaining a constant potential of the first high voltage by controlling an operation of the oscillator according to the result of the comparison.

The second high voltage generation unit includes: a pulse generation circuit for generating a predetermined pumping pulse according to a precharge signal in response to a word line precharging operation; and a pumping circuit for generating a predetermined voltage by a pumping operation using an external supply voltage according to the pumping pulse.

The pulse generation circuit includes: a reverse delay unit for inverting and delaying the precharge signal; and an logic unit for outputting a predetermined pulse in response to inputting the precharge signal and an output signal of the reverse delay unit.

The logic unit comprises: a NAND gate for inputting the precharge signal and the output signal of the reverse delay unit; and an inverter for inverting an output signal of the NAND gate.

The pumping circuit includes a capacitor.

The high voltage generation circuit further includes: a control unit for generating a predetermined control pulse in response to an output signal of the second high voltage generation unit; and a current sinking device for dropping down a potential of the cell word line in response to the control pulse.

The control unit includes: a reverse delay unit for inverting and delaying the pumping pulse; and a logic unit for outputting a predetermined pulse in response to inputting the precharge signal and an output signal of the reverse delay unit.

The logic unit includes a NOR gate.

The current sinking device includes a NMOS transistor.

The current sinking device includes an inverter for inverting an output signal of the control unit, and a PMOS transistor driven by an output signal of the inverter.

Furthermore, the high voltage generation circuit in accordance with another embodiment of the present invention includes: a first high voltage generation unit for generating a first high voltage in response to an enable signal during an active operation and then applying it to a cell word line; a second high voltage generation unit for generating a predetermined pumping pulse in response to the precharge signal and generating a predetermined voltage in response to the pumping signal, and thus applying a second high voltage higher than the first high voltage to the cell word line; a control unit for generating a predetermined control pulse in response to the pumping pulse; and a current sinking device for dropping down a potential of the cell word line in response to the control pulse.

BRIEF DESCRIPTION OF THE DRAWINGS

A more complete understanding of the present invention may be had by reference to the following description when taken in conjunction with the accompanying drawings in which.

DETAILED DESCRIPTION OF PREFERRED EMBODIMENTS

Hereinafter, it will be described about embodiments of the present invention with reference to the accompanying drawings.

Figure 1:
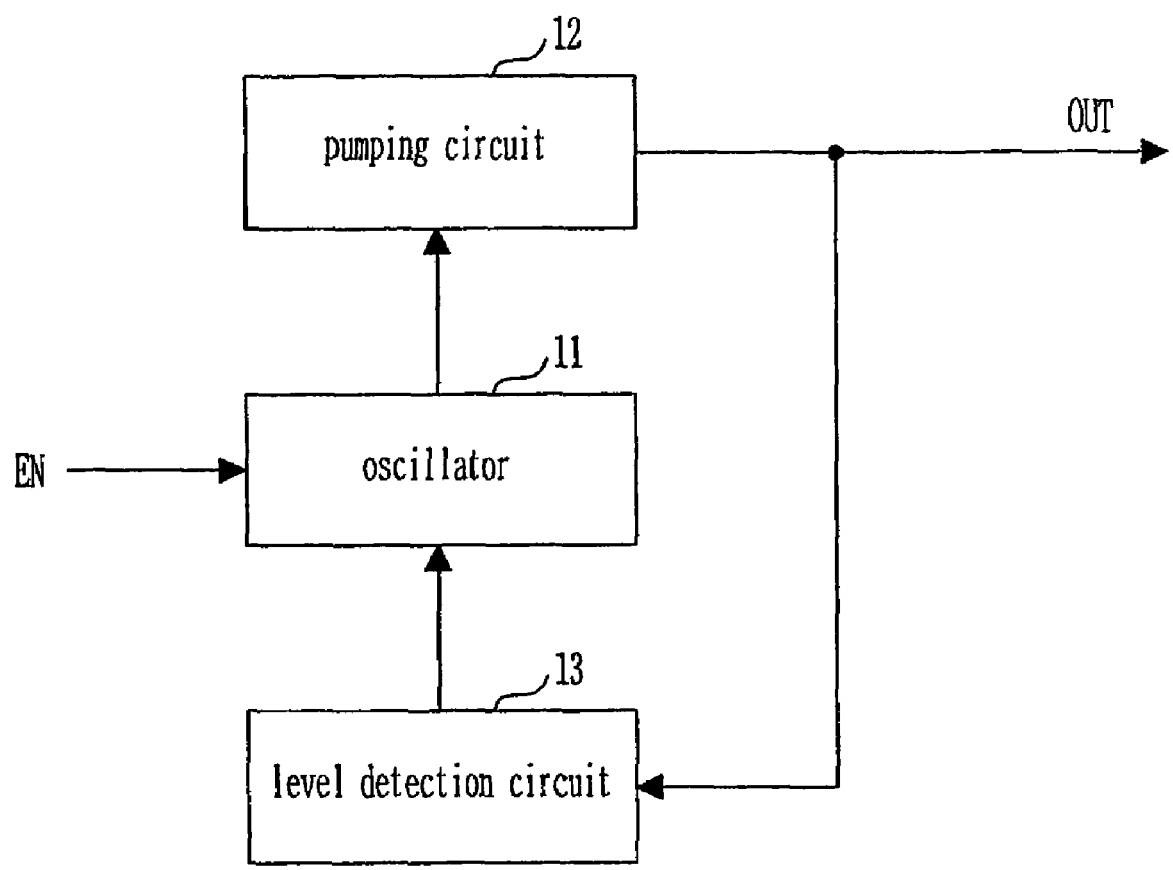
FIG. 1 is a schematic diagram illustrating the conventional high voltage generation circuit.
Figure 2:
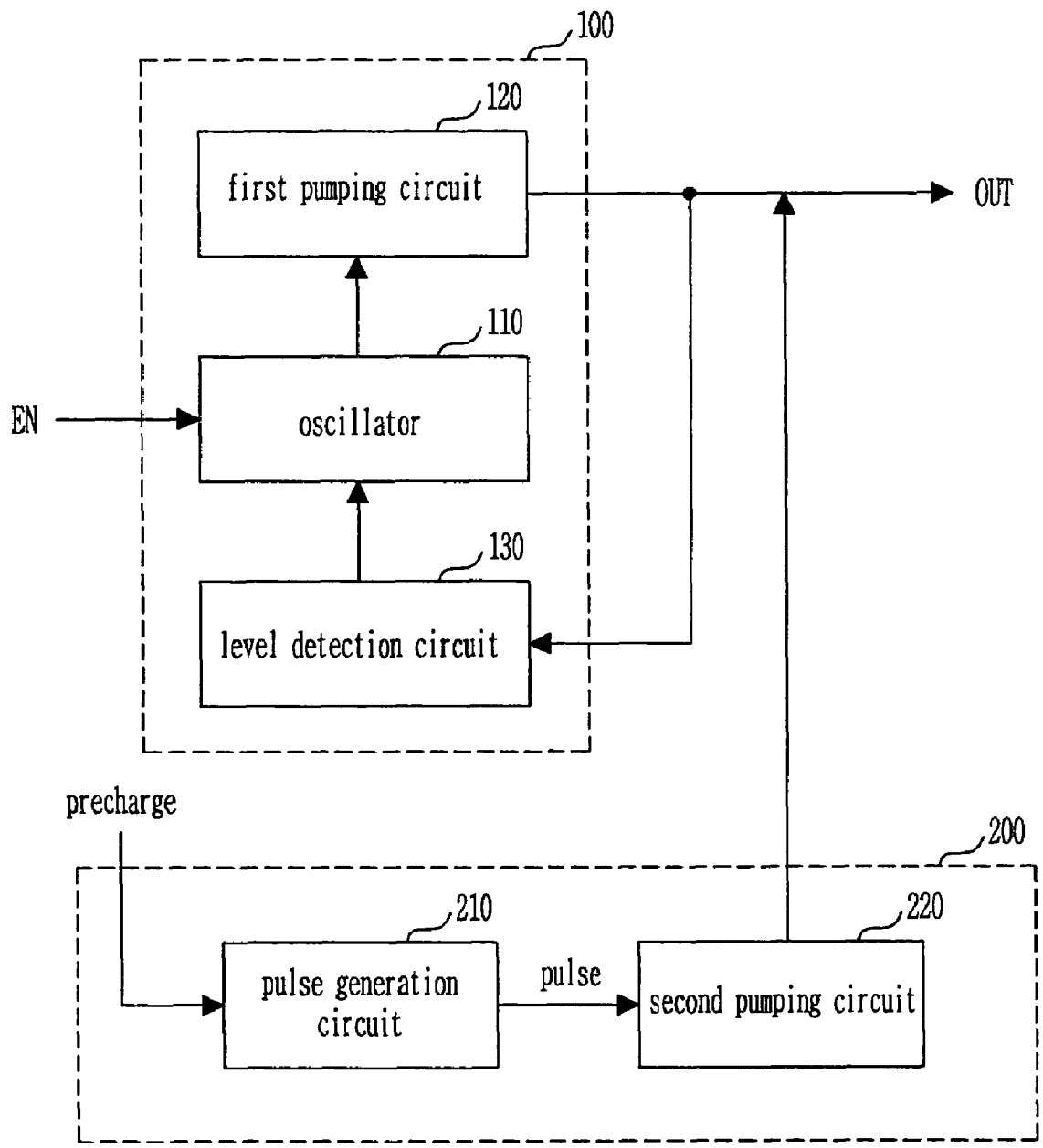
FIG. 2 is a schematic diagram illustrating a high voltage generation circuit in accordance with an embodiment of the present invention.

FIG. 2 is a schematic diagram illustrating a high voltage generation circuit in accordance with the present invention which comprises: a first high voltage generation unit 100 for generating a first high voltage Vpp during an active operation; and a second high voltage generation unit 200 for generating a predetermined voltage α during a precharging operation and then applying a second high voltage Vpp+α higher than the first high voltage Vpp to a cell word line.

The first high voltage generation unit 100 is comprised of an oscillator 110, a first pumping circuit 120, and a level detection circuit 130. The oscillator 110 is operated by an enable signal EN and then generates an oscillation signal OSC. The first pumping circuit 120 generates the first high voltage Vpp by a pumping operation using an external supply voltage Vcc according to the oscillation signal OSC. Moreover, the level detection circuit 130 detects whether or not the first high voltage Vpp is risen to a target value by comparing a reference voltage and the first high voltage Vpp, and according to the result, the level detection circuit 13 controls the operation of the oscillator 110 and maintains a constant potential of the first high voltage Vpp.

The second high voltage generation unit 200 is comprised of a pulse generation circuit 210 and a second pumping circuit 220. The pulse generation circuit 210 generates a predetermined pumping pulse pulse in response to a precharge signal precharge according to a word line precharging operation. The second pumping circuit 220 generates a predetermined voltage α by a pumping operation according to the pumping pulse. Therefore, the cell word line during a precharging operation maintains a potential of the second high voltage Vpp+α which adds the first high voltage Vpp and the predetermined voltage α. On the other hand, the second pumping circuit 220 is comprised of a capacitor.

It will be explained of the high voltage generation circuit in accordance with an embodiment of the present invention constructed as aforementioned.

During an active operation, the first high voltage generation unit 100 is enabled in response to an enable signal EN and then the first high voltage Vpp is generated. The first high voltage Vpp is applied to a cell word line through an output terminal out. During this, for instance, the precharge signal precharge is applied to low level, so that the second high voltage generation unit 200 is disabled. Accordingly, the cell word line, during the active operation, maintains a potential of the first high voltage Vpp.

In condition that the first high voltage is applied to the cell word line, if the precharge signal precharge for a precharging operation is transited from low level to high level and then applied, the second high voltage generation unit 200 is enabled, which results in to generate the predetermined voltage α. As a result, the cell word line, during the precharging operation, maintains a potential of the second high voltage Vpp+α which adds the first high voltage Vpp and the predetermined voltage α. However, the second high voltage Vpp+α applied to the cell word line during the precharging operation is slowly getting decreased because of generating power consumption when disabling a word line. After then, when a voltage applied to a word line is decreased under the first potential of high voltage Vpp, the level detection circuit 130 in the first high voltage generation unit 100 detects it and then operates the oscillator 100. As a result, the oscillator 110 and the first pumping circuit 120 are operated to apply the first high voltage Vpp to the cell word line.

Figure 3:
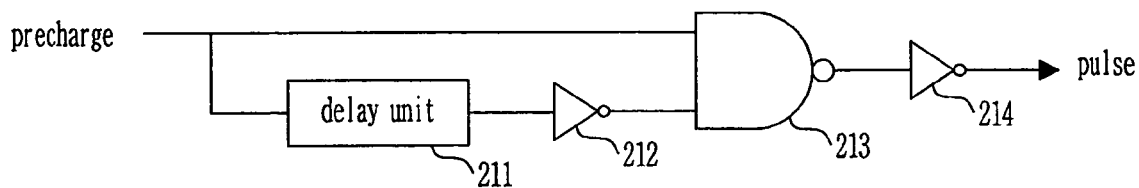
FIG. 3 is a circuit diagram illustrating an embodiment of a pulse generation circuit adaptable to a high voltage generation circuit in accordance with an embodiment of the present invention.

FIG. 3 is a circuit diagram illustrating an embodiment of a pulse generation circuit adaptable to a high voltage generation circuit in accordance with an embodiment of the present invention. The pulse generation circuit in accordance with the present invention is comprised of: a delay unit 211 for delaying a precharge signal precharge for a predetermined time; a first inverter 212 for inverting an output signal of the delay unit 211; a NAND gate 213 for inputting the precharge signal precharge and an output signal of the first inverter 212; and a second inverter 214 for inverting an output signal of the NAND gate 213 and uses a general pulse generation circuit which can control a width of output pulse according to the delay time of the delay unit 211.

In the pulse generation circuit constructed as above, while the precharge signal precharge is transited from low level to high level and then applied to the circuit, and an output signal of the delay unit 211 is inverted by a predetermined delay time of the delay unit 211 and the first inverter 212, to output a high level signal, the NAND gate 213 outputs a low level signal and the low level signal is inverted by the second inverter 214, to output a high level signal. According to the high level signal, the second pumping circuit performs a pumping operation.

Figure 4:
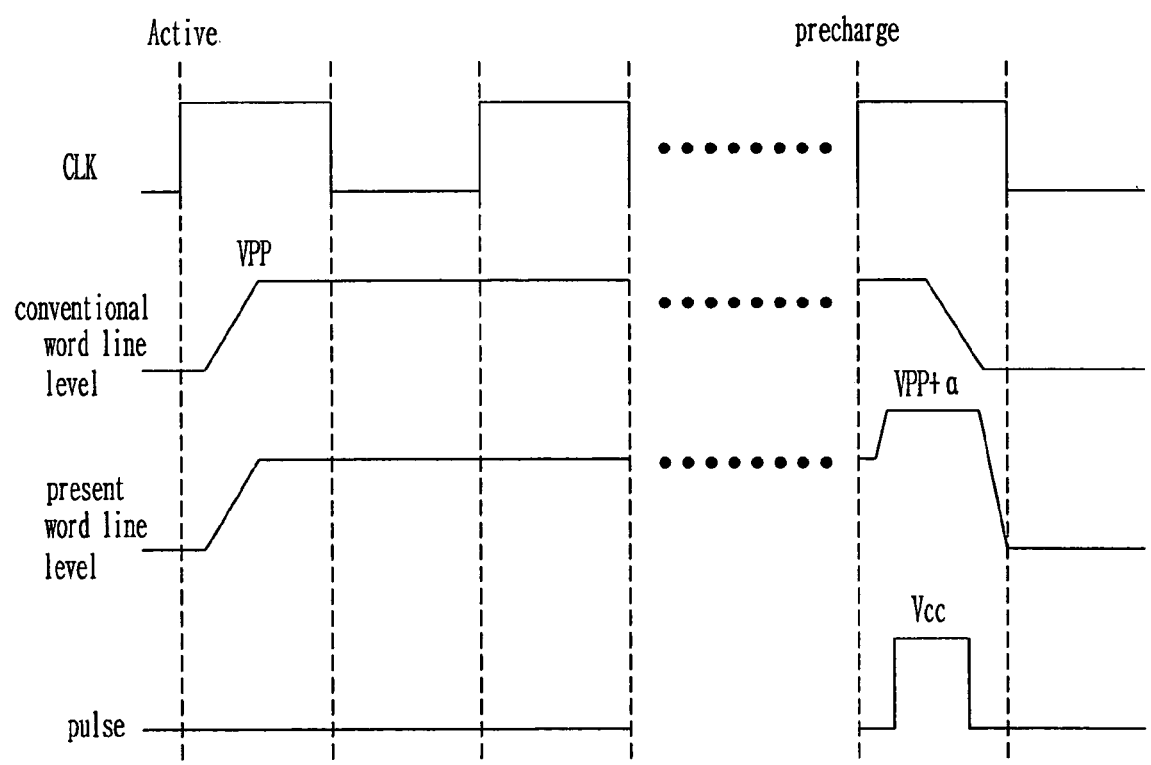
FIG. 4 is a waveform diagram comparing a word line voltage by means of a voltage generated from a high voltage generation circuit in accordance with the present invention.

FIG. 4 is a waveform diagram comparing a word line voltage by means of a high voltage generated from a high voltage generation circuit in accordance with the present invention with a word line voltage by means of a high voltage generated from a high voltage generation circuit in the conventional art. As shown in FIG. 4, when a voltage applied to a word line in a 1 clock cycle time tCK maintains the first high voltage Vpp, the second high voltage Vpp+α, and the potential of the first high voltage Vpp, it can prevent the high voltage level from continually rising although a sequential active/precharge command is inputted during a bank operation driving a word line independently. Therefore, the word line voltage of the present invention can prevent the problem of falling down reliability of the cell transistor, which is caused due to too much stresses occurred by sequentially applying a high voltage to the cell transistor, and can also improve a yield by making it possible to perform a normal operation by means of developing a cell capacitor transferring characteristic of a bitline data.

On the other side, according to an embodiment of the present invention, the second high voltage Vpp+α applied to the cell word line by a high voltage generated by the high voltage generation circuit naturally falls down a level according to power consumption during a word line precharing operation. However, because a level doesn't normally fall down during a high speed operation, it may cause a high voltage level to keep rising. Accordingly, as shown in FIG. 5, it can be adaptable for a method of controlling the high voltage level from keeping rising by using a current sinking device.

Figure 5:
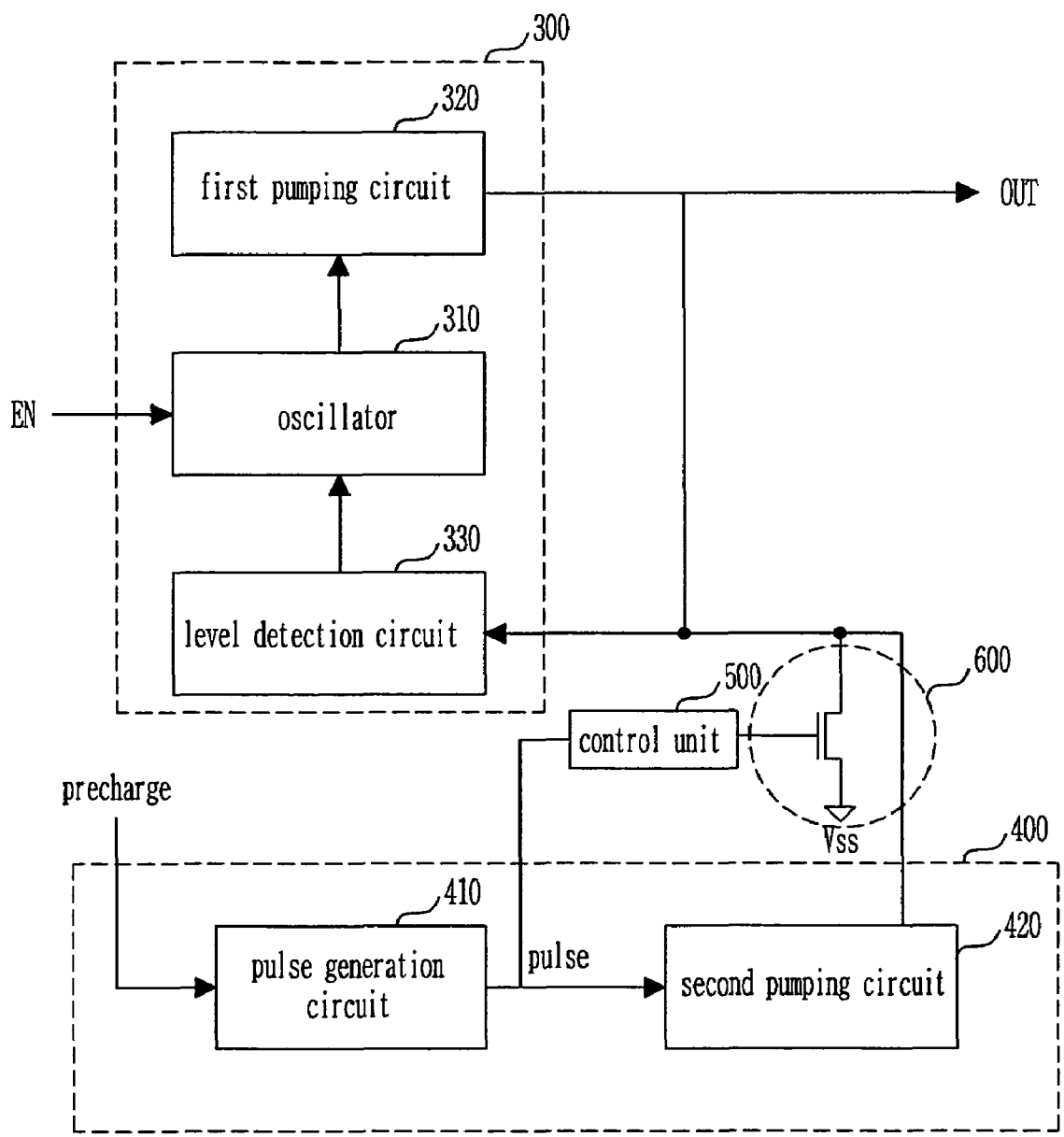
FIG. 5 is a schematic diagram illustrating a high voltage generation circuit in accordance with another embodiment of the present invention.

FIG. 5 is a schematic diagram illustrating a high voltage generation circuit in accordance with an embodiment of the present invention.

A first high voltage generation unit 300 is comprised of an oscillator 310, a first pumping circuit 320, and a level detection circuit 330. The oscillator 310 is operated by an enable signal EN to generate an oscillation signal OSC with a constant period. The first pumping circuit 320 generates a first high voltage Vpp by a pumping operation using an external supply voltage Vcc according to the oscillation signal OSC. The level detection circuit 330 detects whether or not the first high voltage Vpp is risen to a target value by comparing a reference voltage with the first high voltage Vpp, and then according to the result, controls the oscillator 310 and maintains a constant potential of the first high voltage Vpp.

The second high voltage generation unit 400 is comprised of a pulse generation circuit 410 and a second pumping circuit 420. The pulse generation circuit 410 generates a predetermined pumping pulse pulse in response to a precharge signal precharge according to a word line precharging operation. The second pumping circuit 420 generates a predetermined voltage α by a pumping operation in response to the pumping pulse pulse. Accordingly, the cell word line during a precharging operation maintains a potential of the second high voltage Vpp+α which adds the first high voltage Vpp and the predetermined voltage α.

A control unit 500 controls a driving of a current sinking device 600 by generating a predetermined pulse according to the pumping pulse pulse outputted from the pulse generation circuit 410 in the second high voltage generation circuit 400.

The current sinking device 600 is comprised of a NMOS transistor connected between the cell word line and a ground terminal Vss and falls down a potential of the cell word line during an active operation forcibly. Additionally, as another embodiment, the current sinking device 600 is comprised of an inverter for inverting an output signal of the control unit 500 and a PMOS transistor driven by an output signal of the inverter connected between the cell word line and the ground terminal Vss.

In the high voltage generation circuit in accordance with another embodiment of the present invention constructed as above, when the precharge signal precharge is applied to low level and then the pumping pulse pulse generated from the pulse generation circuit 410 is transited from high level to low level, a high level pulse is generated for a short time and the current sinking device 600 is turned on by the high level pulse, to fall down the potential of cell word line forcibly. As a result, it can be improved for a cell operation characteristic by making a stable power supply possible during a high speed operation.

Figure 6:
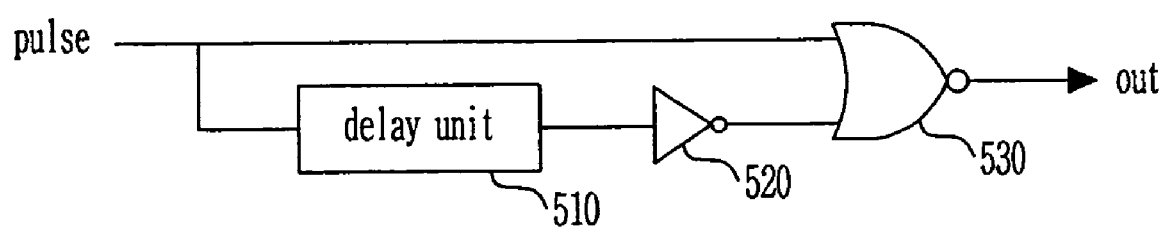
FIG. 6 is a circuit diagram illustrating an embodiment of a control circuit adaptable to a high voltage generation circuit in accordance with another embodiment of the present invention.

FIG. 6 is a schematic diagram of a control unit adaptable to a high voltage generation circuit in accordance with another embodiment of the present invention. A control unit is comprised of a delay unit 510 for delaying the pumping pulse pulse generated from the pulse generation circuit 410 for a predetermined time, an inverter for inverting an output signal of the delay unit 510, and a NOR gate 530 for inputting the pumping pulse pulse and an output signal of the inverter 520, and controls a width of output pulse according to a delay time of the delay unit 510.

It will now be described about a method of driving the control unit constructed as above. If the pumping pulse pulse outputted from the pulse generation circuit 410 according to a precharging operation is transited from high level to low level, the NOR gate 530 inputs the low level pumping pulse pulse and the output signal of the delay unit 520 which has been inputted to low level, to output a high level pulse. The current sinking device 600 is turned on according to the high level pulse. After then, the NOR gate 530, receiving a high level signal through the inverter 520 after a predetermined time through the delay unit 510, outputs a low level pulse and the current sinking device 600 is turned off according to the low level pulse.

As aforementioned, the present invention can improve a yield by controlling a defect due to a write recovery time tWR margin shortage by means of generating the first high voltage during an active operation and generating the second high voltage higher than the first high voltage in sequence during a precharging operation.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A high voltage generation circuit, comprising:
    a first high voltage generation unit for generating a first high voltage during an active operation and then supplying it to a cell word line; and
    a second high voltage generation unit for generating a predetermined voltage in response to a precharge signal during a precharging operation and then supplying the predetermined voltage to the cell word line so that a second high voltage higher than the first high voltage is supplied to the cell word line at the beginning of the precharging operation;
    wherein the second high voltage generation unit includes a pulse generation circuit for generating a pumping pulse in response to the precharge signal and a first pumping circuit for generating the predetermined voltage by a pumping operation using an external supply voltage in response to the pumping pulse.

2. The high voltage generation circuit of claim 1, wherein the first high voltage generation unit includes:
    an oscillator for generating an oscillation signal with a constant period by being driven according to an enable signal;
    a second pumping circuit for generating a first high voltage by a pumping operation using an external supply voltage according to the oscillation signal; and a level detection circuit for comparing the first high voltage with a reference voltage, and then maintaining a constant potential of the first high voltage by controlling an operation of the oscillator, according to the result of comparing.

3. The high voltage generation circuit of claim 1, wherein the pulse generation circuit includes:
   a reverse delay unit for inverting and delaying the precharge signal; and
   a logic unit for outputting the pumping pulse in response to the precharge signal and an output signal of the reverse delay unit.

4. The high voltage generation circuit of claim 3, wherein the logic unit includes:
   a NAND gate for logically combining the precharge signal and the output signal of the reverse delay unit; and
   an inverter for inverting an output of the NAND gate.

5. The high voltage generation circuit of claim 1, wherein the first pumping circuit includes a capacitor.

6. The high voltage generation circuit of claim 1, further including:
   a control unit for generating a control pulse in response to the pumping pulse generated by the first pulse generation circuit; and
   a current sinking device for dropping down a potential of the cell word line in response to the control pulse.

7. The high voltage generation circuit of claim 6, wherein the control unit includes:
   a reverse delay unit for inverting and delaying the pumping pulse; and
   a logic unit for outputting the control pulse in response to the pumping pulse and an output signal of the reverse delay unit.

8. The high voltage generation circuit of claim 7, wherein the logic unit includes a NOR gate.

9. The high voltage generation circuit of claim 5, wherein the current sinking device includes a NMOS transistor.

10. The high voltage generation circuit of claim 5, wherein the current sinking device includes:
    an inverter for inverting an output signal of the control unit; and
    a PMOS transistor driven by an output signal of the inverter.

11. A high voltage generation circuit, comprising:
    a first high voltage generation unit for generating a first high voltage in response to an enable signal and then supplying it to a cell word line;
    a second high voltage generation unit for generating a predetermined voltage using an internally generated pumping pulse in response to a precharge signal during a precharging operation and then supplying the predetermined voltage to the cell word line so that a second high voltage higher than the first high voltage is supplied to the cell word line at the beginning of the precharging operation;
    a control unit for generating a control pulse in response to the pumping pulse; and
    a current sinking device for dropping down a potential of the cell word line in response to the control pulse.

12. The high voltage generation circuit of claim 11, wherein the first high voltage generation unit includes:
    an oscillator for generating an oscillation signal with a constant period by being driven according to an enable signal;
    a pumping circuit for generating a first high voltage by a pumping operation using an external supply voltage according to the oscillation signal; and
    a level detection circuit for comparing the first high voltage with a reference voltage, and then maintaining a constant potential of the first high voltage by controlling an operation of the oscillator, according to the result of comparing.

13. The high voltage generation circuit of claim 11, wherein the second high voltage generation unit includes:
    a pulse generation circuit for generating the pumping pulse in response to the precharge signal; and
    a pumping circuit for generating the predetermined voltage by a pumping operation using an external supply voltage in response to the pumping pulse.

14. The high voltage generation circuit of claim 13, wherein the pulse generation circuit includes:
    a reverse delay unit for inverting and delaying the precharge signal; and
    a logic unit for outputting the pumping pulse in response to the precharge signal and an output signal of the reverse delay unit.

15. The high voltage generation circuit of claim 14, wherein the logic unit includes:
    a NAND gate for logically combining the precharge signal and the output signal of the reverse delay unit; and
    an inverter for inverting an output of the NAND gate.

16. The high voltage generation circuit of claim 13, wherein the pumping circuit includes a capacitor.

17. The high voltage generation circuit of claim 11, wherein the control unit includes:
    a reverse delay unit for inverting and delaying the pumping pulse; and
    a logic unit for outputting the control pulse in response to the pumping pulse and an output signal of the reverse delay unit.

18. The high voltage generation circuit of claim 17, wherein the logic unit includes a NOR gate.

19. The high voltage generation circuit of claim 11, wherein the current sinking device includes a NMOS transistor.

20. The high voltage generation circuit of claim 1, wherein the first pumping circuit generates the predetermined voltage using an external supply voltage.

* * * * *